(12) United States Patent
Papakos et al.

(10) Patent No.: US 9,280,883 B2
(45) Date of Patent: Mar. 8, 2016

(54) METHOD AND APPARATUS FOR VISUALLY AND AUDIBLY INDICATING THE SETUP AND MAINTENANCE OF A SYSTEM

(71) Applicants: Kimon Papakos, Evanston, IL (US); Mark E Boduch, Geneva, IL (US)

(72) Inventors: Kimon Papakos, Evanston, IL (US); Mark E Boduch, Geneva, IL (US)

( * ) Notice: Subject to any disclaimer, the term of this patent is extended or adjusted under 35 U.S.C. 154(b) by 0 days.

(21) Appl. No.: 14/486,603

(22) Filed: Sep. 15, 2014

(65) Prior Publication Data

US 2015/0084781 A1 Mar. 26, 2015

Related U.S. Application Data

(60) Provisional application No. 61/880,863, filed on Sep. 21, 2013, provisional application No. 61/885,067, filed on Oct. 1, 2013.

(51) Int. Cl.
| | |
|---|---|
| *G08B 5/22* | (2006.01) |
| *G08B 7/06* | (2006.01) |
| *G08B 5/36* | (2006.01) |
| *H01L 21/00* | (2006.01) |
| *G02B 1/00* | (2006.01) |

(52) U.S. Cl.
CPC .. *G08B 7/06* (2013.01); *G08B 5/36* (2013.01); *G02B 1/00* (2013.01); *H01L 21/00* (2013.01)

(58) Field of Classification Search
CPC .................................. H01L 21/00; G02B 1/00
See application file for complete search history.

(56) References Cited

U.S. PATENT DOCUMENTS

2006/0045457 A1\* 3/2006 Ng .................. G02B 6/3895
385/134

\* cited by examiner

*Primary Examiner* — Shirley Lu

(57) ABSTRACT

Example embodiments of the present invention relate to a method and apparatus for visually and audibly indicating the setup and maintenance of a system.

7 Claims, 4 Drawing Sheets

METHOD AND APPARATUS FOR VISUALLY AND AUDIBLY INDICATING THE SETUP AND MAINTENANCE OF A SYSTEM

RELATED APPLICATION

This application claims the benefit of: U.S. Provisional Application No. 61/880,863, filed on Sep. 21, 2013, and U.S. Provisional Application No. 61/885,067, filed on Oct. 1, 2013.

The entire teachings of the above applications are incorporated herein by reference.

BACKGROUND

The present invention relates generally to visually and audibly indicating the setup and maintenance of a system.

SUMMARY

A method and corresponding apparatus in an example embodiment of the present invention relates to providing a means of supplying visual and audible indicators to set up and maintain a system.

The method of setting up a system comprises: identifying locations within the system using at least one light source. The at least one light source may be located on a circuit pack front panel within the system. The at least one light source may be located on a backplane within the system. The at least one light source may be located on a non-removable portion of a system chassis. The at least one light source may be a light emitting diode. The at least one light source may emit a substantially white color. The at least one light source may be a multi-color Light Emitting Diode. The at least one light source may behave such that the at least one light source blinks on and off. The at least one light source may be illuminated with a constant illumination. The at least one light source may behave such that the at least one light source changes color as a way of providing feedback to a user. The at least one light source may be a white light LED.

The at least one light source may comprise at least two light emitting diodes that are co-packaged together.

The method may further comprise audibly issuing instructions and feedback. Alternatively or additionally, the method may further comprise displaying visual instructions and feedback.

The method may further comprise installing at least one cable into a first system connector location and into a second system connector location, wherein the at least one light source indicates the first system connector location, and wherein a second light source indicates the second system connector location.

The method may further comprise identifying a connector in the system by illuminating a light source located next to the connector.

The method may further comprise identifying a circuit pack location in the system by illuminating a light source on a backplane of the system.

The method the system is an optical communications system.

The method may further comprise a cable identified by a first light source indicating a first connector on a first circuit pack within the system and a second light source indicating a second connector on a second circuit pack within the system. The method may further comprise flashing the first light source and the second light source on and off until the cable is fully installed. The method may further comprise illuminating the first light source and the second light source with a constant illumination after the cable is fully installed. The method may further comprise providing an audio indication after the cable is fully installed. Furthermore, the audio indication may comprise at least one beep. Furthermore, the audio indication may comprise a verbal acknowledgement.

The present invention includes a system comprising: at least one light source used to identify at least one location in the system. The at least one light source may be a light emitting diode. The system may further comprise at least one circuit pack and a backplane with at least one circuit pack slot for the at least one circuit pack, wherein the at least one circuit pack slot may be identified with the at least one light source. The system may further comprise at least one circuit pack, wherein the at least one circuit pack may have a front panel comprising the at least one light source used to identify the circuit pack when it is installed within the system. In the system, the at least one light source may be mounted on the system to illuminate a portion of the system.

The system may further comprise: a system front and at least one circuit pack, wherein the at least one circuit pack may have the at least one light source mounted on it to illuminate the system front. The system may further comprise: at least a second light source, a plurality of inner circuit packs arranged in a first row and at least a second row, and at least one outer circuit pack, wherein the first row may be illuminated by the at least one light source, and wherein the at least second row may be illuminated by the at least second light source.

The system may further comprise: a first row of inner circuit packs, at least a second row of inner circuit packs, a leftmost outer circuit pack slot, a rightmost outer circuit pack slot, and an outer circuit pack, wherein the outer circuit pack may individually illuminate the first row of inner circuit packs and the at least second row of inner circuit packs when it is placed into the rightmost outer circuit pack slot, and wherein the outer circuit pack may individually illuminate the first row of inner circuit packs and the at least second row of inner circuit packs when it is placed into the leftmost outer circuit pack slot.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION

A description of example embodiments of the invention follows.

Figure 1:
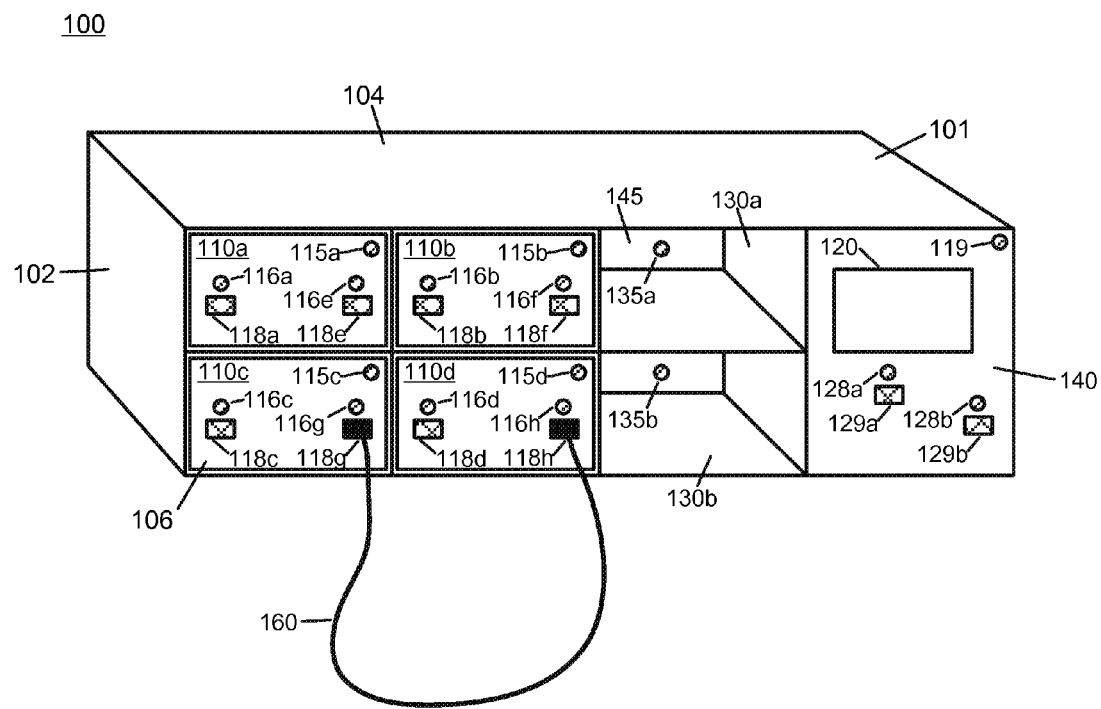
FIG. 1 is an illustration of a system with a non-removable portion in an example embodiment of the present invention.

FIG. 1 is an illustration of a system 100 consisting of a chassis 101 and a cable 160. The chassis 101 comprises of a top chassis exterior 104, a first side exterior 102, a second side exterior (not shown), a bottom exterior (not shown), a front exterior 106, and a backplane 145 containing plurality of electrical connectors. The chassis 101 further comprises of circuit pack slots for six pluggable circuit packs. Four circuit pack slots contain pluggable circuit packs 110a, 110b, 110c, and 110d, while the remaining two circuit pack slots 130a and 130b are unoccupied. In addition to the six circuit pack slots for pluggable circuit packs, the chassis also contains a non-removable portion 140.

The non-removable portion contains an optional display screen 120, a light source 119 used to identify the non-removable portion of the chassis, a first connector 129a with a first connector light source identifier 128a, and a second connector 129b with a second connector light source identifier 128b.

The front panel of each pluggable circuit pack 110a-d includes a circuit pack identifier light source 115a-d, a first front panel connector 118a-d with a first connector light source identifier 116a-d, and a second connector 118e-h with a second connector light source identifier 116e-h.

The backplane further comprises of at least one circuit pack slot identifying light source 135a-b for each circuit pack slot.

The invention includes a method of setting up a system comprising of using light sources, 119, 128a-b, 135a-b, 115a-d, and 116a-h to identify locations within the system.

In a first example method, a user is instructed to insert a circuit pack into a circuit pack slot of the system. The light source on the backplane (135a for example) of the circuit pack slot to insert the circuit pack is illuminated in order to indicate to the user the correct circuit pack slot to insert the circuit pack into. The instructions to insert the circuit pack may be displayed on a display 120 within the system, and or may be provided to the user in an audible manner (via stored digitally encoded audio information) by using an electronic speaker (not shown) built into the system or by via an audio jack (not shown) built into the system. The light source may be a white light source in the form of a whit-light Light Emitting Diode (LED), or the light source may be a multi-color light source in the form of a multi-color LED. Each multi-color LED may be comprised of two or three co-packaged light emitting diodes. When indicating the circuit pack slot to place the circuit pack, the light source may blink on and off at some visible rate, or it may simply be illuminated in a steady state (i.e., a constant illumination), or it may be illuminated with a repeatable sequence of on/off blinking, followed by a period of steady state illumination (constant illumination), followed by on/off blinking again. Alternatively, the light source may blink several times following a first audible instruction to insert the circuit pack, and then be illuminated with a constant illumination for some predetermined period of time, after which a second blinking sequence occurs, followed by a second audible instruction to insert the circuit pack.

Once a circuit pack is placed into the circuit pack slot with the illuminated light source on the backplane, the system determines if the correct circuit pack is placed into the correct circuit pack slot. If the correct circuit pack is placed into the correct circuit pack slot, the system provides either audio feedback (via the speaker or audio jack) and or visual feedback (via the display) to indicate that the setup was done correctly. Otherwise, the system provides either audio feedback (via the speaker or audio jack) and or visual feedback (via the display) to indicate that the setup was done incorrectly.

The system may have knowledge of what circuit packs need to be installed within the system based upon previous actions of the user. For instance, the system may be one node of an optical communication system, and a network of nodes may have been designed using a network planning tool, and the network planning tool may have determined which circuit packs were needed in each of the nodes, wherein a node may consist of one or more chassis such as chassis 101.

A second example method of using light sources to identify locations within the system involves connecting one end of a cable to a first connector on a first circuit pack, and then connecting the other end of the cable to a second connector on a second circuit pack. The system may first provide audio instructions (via a speaker or audio jack) to install the cable, and or visual instructions to install the cable (via a built in display 120, or external display (not shown)). The system may then indicate the first circuit pack by blinking illumination or constant illumination of the circuit pack identifying light source (115c, for example), while simultaneously blinking or providing constant illumination of the light source (116g, for example) identifying the first connector (118g, for example). The system may also simultaneously indicate the second circuit pack by blinking illumination or constant illumination of the circuit pack identifying light source (115d, for example), while simultaneously blinking or providing constant illumination of the light source (116h, for example) identifying the second connector (118h, for example).

If the cable is installed correctly, the system may stop illuminating the circuit pack identifier light source (115c-d), and stop illuminating the connector light sources 116g-h. Alternatively if the system was blinking the involved light sources prior to installation, the system may stop blinking the circuit pack identifier light source (115c-d), and stop blinking the connector light sources 116g-h once the cable is installed correctly. The system may then provide audio or visual feedback to the user that the cable installation was done correctly. The audio feedback may be a simple beep or a series of beeps if the cable is installed correctly. Alternatively, the audio feedback could be a simple verbal acknowledgment in the form of a voice message (via stored digitally encoded audio information) indicating that the cable was installed correctly.

If the cable is not installed correctly, the system may provide audio and or visual feedback to the user that the cable installation was not done correctly. The system may also provide additional information to the user. For instance, if the cable was installed correctly to the first connector and not to the second connector, the system may indicate this in a visual and or audible manner using the display and or speaker, and may additionally continue to blink the light source associated with the second connector, but stop blinking or illuminating the first connector.

In a similar manner, the system may change the color of light sources when setting up a system in order to provide feedback to the user. For instance, when installing a cable, the system may illuminate the light sources of the two connectors with a white light prior to the user installing the cable. If the cable is installed correctly, the light sources of the two connectors may change to a green illumination. If the cable is installed on a wrong connector, the light source of that connector may be changed to a red illumination.

The method of setting up a system may include using a light source on a non-removable portion of a system chassis. For instance, the system may instruct the user to attach a cable from connector 118b on circuit pack 110b to connector 129a on non-removable portion 140 of chassis 101. For this case, light sources 115b, 116b, 119, and 128a may be illuminated in a way to indicate the needed connection from connector 118b to connector 129a.

The invention further includes a method of maintaining a system using light sources to identify locations within a system. For instance, the system may indicate a bad cable connection by blinking illumination or constant illumination of the light sources identifying the connectors to which the cable is attached. The user can then visually see which cable needs replacing prior to the replacement. As another example, when a fan filter requires replacement, a light source associated with the fan filter may blink on and off or be illuminated with a constant illumination in order to guide the user to the fan filter that requires replacement.

The invention includes a system with user assisted mechanisms for system setup, comprising of at least one light source to identify at least one location in the system. The light source may be implemented with a light emitting diode. The system may be further comprised of at least one circuit pack, and a backplane with at least one circuit pack slot, wherein the at least one circuit pack slot is identified with the at least one light source.

The system may further include at least one circuit pack wherein the at least one circuit pack contains a front panel with a light source used to identify the circuit pack once it is installed within the system.

The user assisted mechanisms used to setup or maintain a system may additionally include at least one light source provided for the means of illuminating a portion of the system.

Figure 2A:
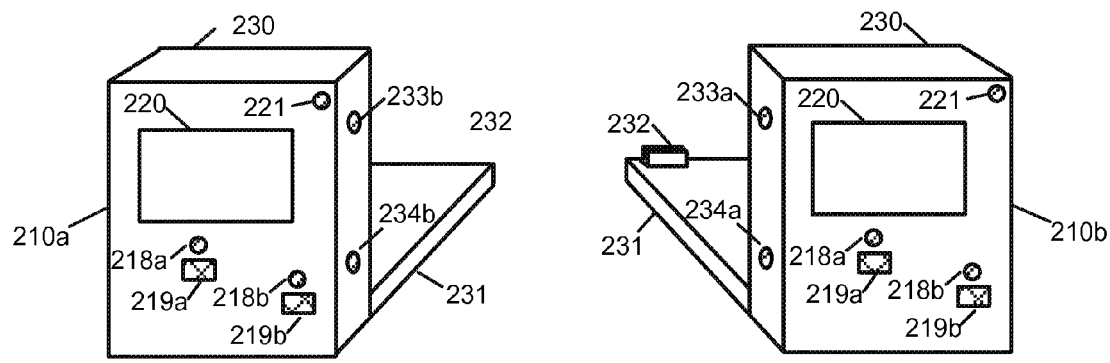
FIG. 2A is an illustration of a first outer circuit pack of a system in an example embodiment of the present invention.

FIG. 2A shows two views 200 of an outer circuit pack 210a-b, with light sources 233a-b, 234a-b used to illuminate portions of a system. The outer circuit pack can be installed in the outer circuit pack slots of a chassis, as shown in FIG. 3, wherein an outer circuit pack 210 is inserted into the right outer circuit pack slot of chassis 301.

FIG. 2A, shows two views of the same circuit pack. Circuit pack view 210a shows the front and right side of the circuit pack, while circuit pack view 210b shows the front and left side of the circuit pack. Circuit pack view 210a shows the two light sources 233b and 234b on the right side of head-end 230 of the circuit pack, while circuit pack view 210b shows the two light sources 233a and 234a on the left side of head-end 230 of the circuit pack. Circuit pack 210 further includes an optional display 220, circuit pack light source identifier 221, optional connectors 219a-b, connector light source identifiers 218a-b, printed circuit board 231, and electrical backplane connector 232.

Figure 3:
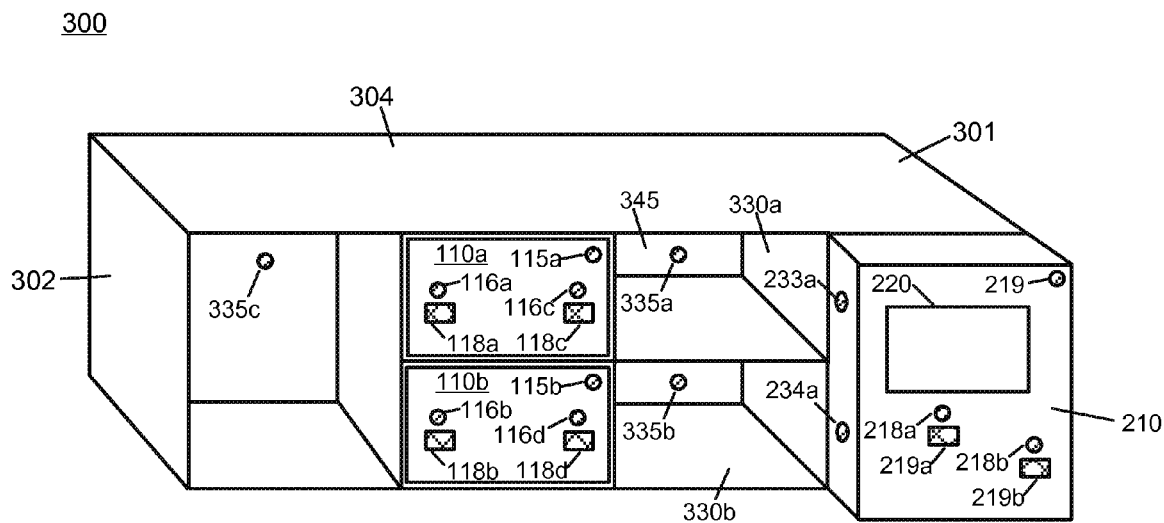
FIG. 3 is an illustration of a system with two inner circuit packs and one outer circuit pack in an example embodiment of the present invention.

When outer circuit pack 210 is plugged into the right outer circuit pack slot as shown in FIG. 3, light source 233a can be illuminated with constant illumination in order to illuminate the inner circuit packs (including 110a) of the top row of the chassis 301. Similarly, light source 234a can be illuminated with constant illumination in order to illuminate the inner circuit packs (including 110b) of the bottom row of the chassis 301. When placed in the right outer circuit pack slot, the circuit pack 210 will not illuminate its light sources 233b and 234b.

Figure 4:
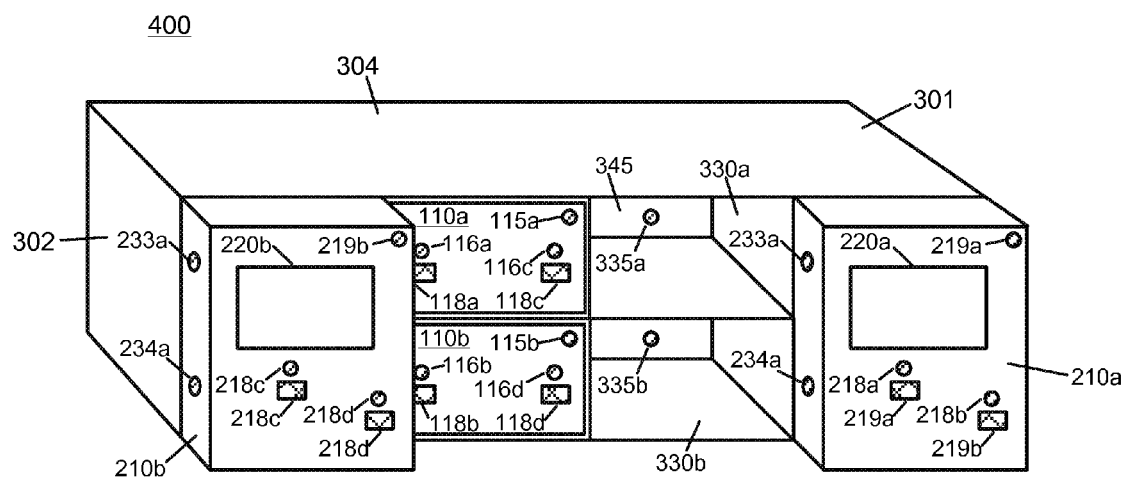
FIG. 4 is an illustration of a system with two inner circuit packs and two outer circuit packs in an example embodiment of the present invention.

When outer circuit pack 210 is plugged into the left outer circuit pack slot as shown in FIG. 4 (210b), light source 233b can be illuminated with constant illumination in order to illuminate the inner circuit packs (including 110a) of the top row of the chassis 301. Similarly, light source 234b can be illuminated with constant illumination in order to illuminate the inner circuit packs (including 110b) of the bottom row of the chassis 301. When placed in the left outer circuit pack slot, the circuit pack 210 will not illuminate its light sources 233a and 234a.

The light sources 233a-b and 234a-b provide illumination on the inner circuit packs which allow the user to more clearly see the inner circuit packs and their associated front panel connections. This allows for easier setup and maintenance of the system.

Figure 2B:
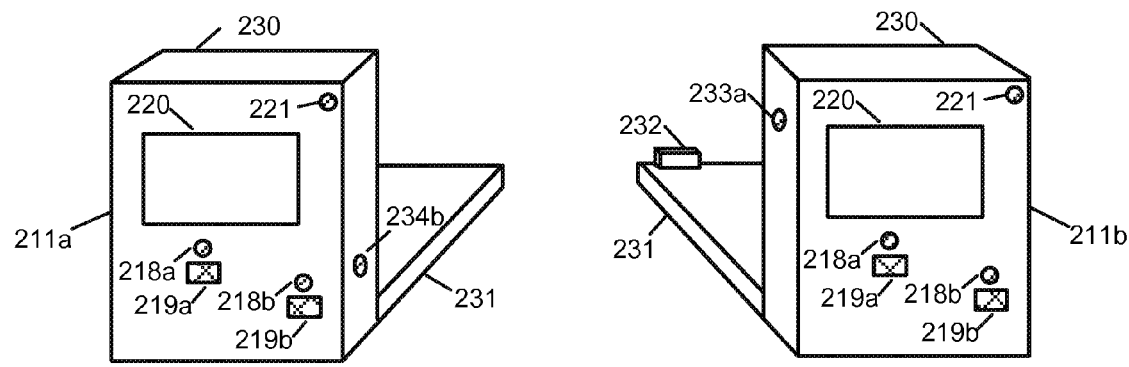
FIG. 2B is an illustration of a second outer circuit pack of a system in an example embodiment of the present invention.

FIG. 2B shows an alternative outer circuit pack 211a-b. This circuit pack has only a single light source placed on each side of its head-end, but the light sources are staggered such that when both outer circuit packs are placed within the chassis, each row of inner circuit packs gets illuminated by a light source.

In FIG. 2B, 211 a shows the front and right side of outer circuit pack 211, while 211b shows the front and left side of outer circuit pack 211. As can be seen, when both the left and right outer circuit packs are placed in the chassis, light source 233a of the right outer circuit pack 211b will illuminate the top row of the inner circuit packs, while light source 234b of the left outer circuit pack 211 will illuminate the bottom row of the inner circuit packs.

Key to outer circuit pack 210 is the inclusion of a head-end that protrudes from the circuit pack such that a light source can be placed on the side of the head-end in order to illuminate the inner circuit packs once the outer circuit pack is placed within the chassis.

All light sources used for identification purposes (i.e., identifying a circuit pack slot in a backplane, identifying a circuit pack, identifying a connector, etc.), may additionally be used for purposes other than for setup and maintenance purposes. For instance, a connector identifying light source may also be used to indicate that the link associated with the connector is good. This could be done perhaps by illuminating the connector identifying light source with a constant green illumination when the link associated with the connector is good and carrying information without any problems.

What is claimed is:

1. A system comprising:
    at least one light source used to identify at least one location in the system;
    a first row of inner circuit packs;
    at least a second row of inner circuit packs;
    a leftmost outer circuit pack slot;
    a rightmost outer circuit pack slot; and
    an outer circuit pack,
    wherein the outer circuit pack individually illuminates the first row of inner circuit packs and the at least a second row of inner circuit packs when it is placed into the rightmost outer circuit pack slot, and wherein the outer circuit pack individually illuminates the first row of inner circuit packs and the at least a second row of inner circuit packs when it is placed into the leftmost outer circuit pack slot.

2. The system of claim 1, wherein the at least one light source is a light emitting diode.

3. The system of claim 1, further comprising a backplane with at least one circuit pack slot for at least one circuit pack, wherein the at least one circuit pack slot is identified with the at least one light source.

4. The system of claim 1, wherein at least one circuit pack has a front panel comprising the at least one light source, wherein the at least one circuit pack is identified with the at least one light source when the at least one circuit pack is installed within the system.

5. The system of claim 1, wherein the at least one light source is mounted on the system to illuminate a portion of the system.

6. The system of claim 1, further comprising a system front, wherein at least one circuit pack has the at least one light source mounted on it to illuminate the system front.

7. The system of claim 1, further comprising at least a second light source,
wherein the first row of inner circuit packs is illuminated by the at least one light source, and wherein the at least a second row of inner circuit packs is illuminated by the at least a second light source.

* * * * *